(12) United States Patent
Brewer (10) Patent No.: US 6,456,159 B1
(45) Date of Patent: Sep. 24, 2002

(54) CMOS OPERATIONAL AMPLIFIER (75) Inventor: Robert J. Brewer, Lambourn (GB)

(73) Assignee: Analog Devices, Inc., Norwood, MA (US)

( * ) Notice: Subject to any disclaimer, the term of this patent is extended or adjusted under 35 U.S.C. 154(b) by 30 days.

(21) Appl. No.: 09/657,746

(22) Filed: Sep. 8, 2000

(51) Int. Cl.$^7$ .............................. H03F 1/02; H03F 1/14; H03F 3/45; H03K 17/00
(52) U.S. Cl. ............................. 330/9; 330/51; 330/253; 327/124
(58) Field of Search .............................. 330/9, 51, 253; 327/124

(56) References Cited

U.S. PATENT DOCUMENTS

| | | | | |
|---|---|---|---|---|
| 4,097,806 A | * | 6/1978 | Evans | 375/231 |
| 4,559,502 A | | 12/1985 | Huijsing | 330/294 |
| 4,622,521 A | | 11/1986 | Redfern | 330/9 |
| 4,912,423 A | * | 3/1990 | Milkovic et al. | 330/255 |
| 4,933,642 A | | 6/1990 | Lee | 330/9 |
| 5,442,318 A | | 8/1995 | Badyal et al. | 330/253 |
| 5,789,981 A | | 8/1998 | Singer et al. | 330/253 |
| 5,886,528 A | * | 3/1999 | Perry | 324/109 |

OTHER PUBLICATIONS

The ICL7650S: A New Era in Glitch–Free Chopper Stabilized Amplifiers (Application Note 053), Intersil Corporation, 1999.

OP250/OP450 CMOS Single–Supply Rail–to–Rail Input/Output Operational Amplifiers Data Sheet, Analog Devices, Inc., Rev. O, Oct., 1997.

AD8591/AD8592/AD8594 CMOS Single Supply Rail–to–Rail Input/Output Operational Amplifiers with Shutdown Data Sheet, Analog Devices, Inc., Rev. A, Feb. 1999.

* cited by examiner

Primary Examiner—Patricia Nguyen
(74) Attorney, Agent, or Firm—Wolf, Greenfield & Sacks, P.C.

(57) ABSTRACT

An improved chopped CMOS operational amplifier that includes a modulator having differential input and output connections, an AC amplifier coupled to the modulator output, a demodulator coupled to the AC amplifier output, and an integrator coupled to the demodulator output. The improvement is realized in that the operational amplifier has a gain path comprising at least four inverting amplifiers, wherein three or a greater odd number of the inverting amplifiers comprise an integrator that is rendered stable by incorporating a nested integrating capacitor within the integrator, and at least one of the inverting amplifiers is coupled to the modulator output and configured as the AC amplifier. In another aspect of the invention, a second demodulator is introduced to derive a compensating signal that tends to counteract offset voltage components attributable to modulator switch mismatch. In a further aspect of the invention, an interface network is inserted between the modulator and the AC amplifier to open the main signal path during transitions of the modulator clock signals.

22 Claims, 10 Drawing Sheets

CMOS OPERATIONAL AMPLIFIER

FIELD OF THE INVENTION

This invention relates generally to operational amplifiers and in particular to CMOS operational amplifiers, and is more particularly directed toward small geometry CMOS operational amplifier architectures suitable for implementation in deep sub-micron processes.

BACKGROUND OF THE INVENTION

An op amp (operational amplifier) architecture is desirable which is suited to current and foreseeable future generations of small geometry CMOS (complementary metal-oxide-semiconductor), manufactured economically in high volume for digital circuitry. Modern deep sub-micron (DSM) processes have gate lengths much less than one micron. DSM scaling also requires scaling the gate oxide thickness which requires scaling the supply voltage: for example, from 0.6 $\mu$m (microns) at 5 volts down to 0.13 $\mu$m at 1.0 volt.

Figure 1:
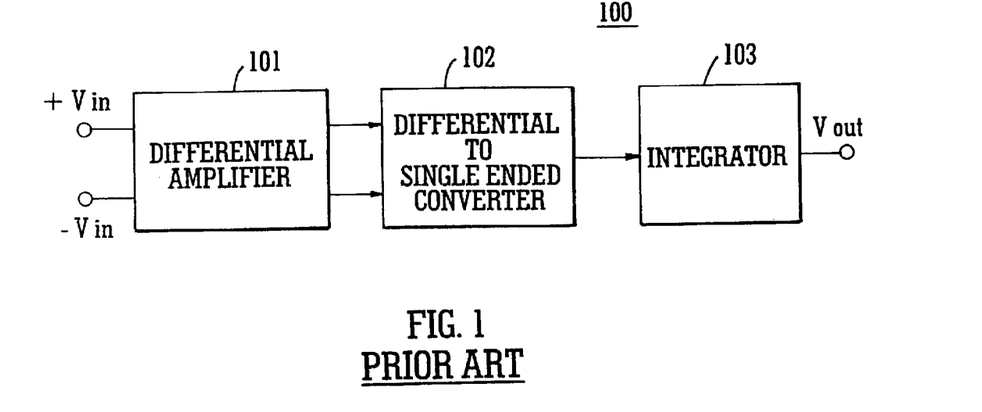
FIG. 1 is a block diagram of a conventional operational amplifier of the prior art.

The conventional op amp, illustrated in FIG. 1 in block diagram form, and generally depicted by the numeral 100, comprises two gain stages. The first functions as a differential transconductance ($g_m$) stage 101 and the second as an integrator 103, separated by a differential to single-ended converter 102. The conventional op amp 100 is illustrated in more detail in FIG. 2.

Figure 2:
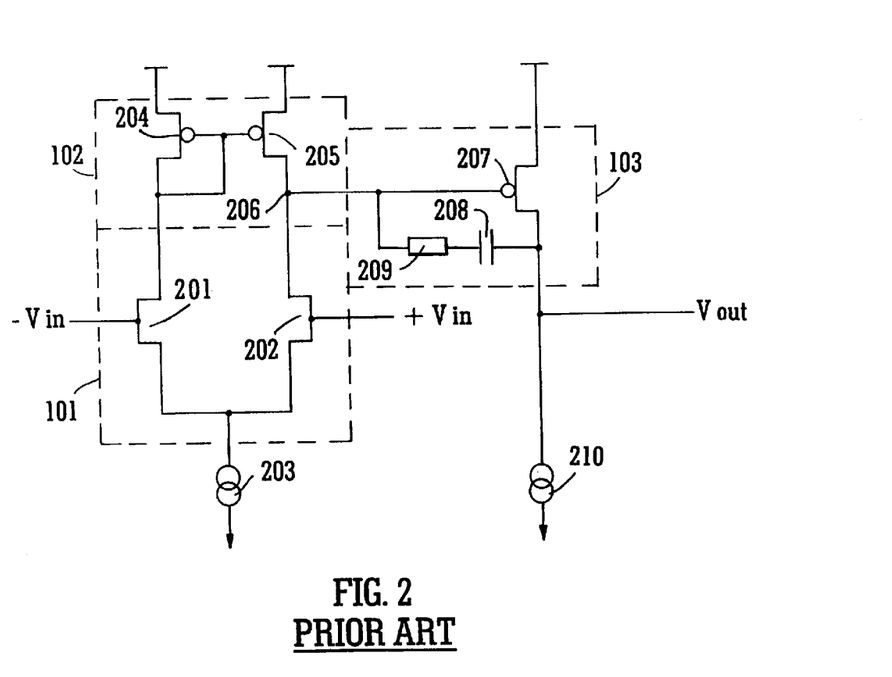
FIG. 2 depicts a simplified schematic diagram of the conventional operational amplifier of FIG. 1.

As shown in FIG. 2, the $g_m$ stage 101 comprises a differential pair 201, 202 with a single current source "tail" 203 (both typically, and as an example, n-type insulated-gate field effect transistors), and two current source loads 204, 205 (typically, and as an example, provided by p-type transistors). By selecting an output 206 from only one of the differential input stages, differential to single-ended conversion is accomplished.

This single-ended output 206 is then applied to the integrator stage 103. In the implementation shown, the integrator 103 includes a p-type output transistor 207 with a current source tail 210, and Miller capacitor 208. A nulling resistor 209 has been added for the sake of stability. This configuration requires the negative supply to exceed the most negative input signal voltage by one $V_t$ plus one saturation voltage, and the positive supply to exceed the most positive input signal voltage by one saturation voltage less one $V_t$. $V_t$ is the threshold voltage of the MOS transistors 201, 202 above which conduction occurs.

In the conventional op amp implementation, the integrator comprises an inverter and Miller capacitor. In DSM CMOS, the gain of a simple inverter is low, so it is usually necessary to cascode both active devices. The supply voltage in total must therefore exceed the maximum signal swing by four saturation voltages. Consequently, this architecture is difficult to implement where the supply voltage is constrained by DSM processing.

The DSM CMOS technology also suffers from DC and low frequency mismatching and noise, resulting in the amplifier described above having poor offsets and noise performance. To condition signals from a high impedance source it is desirable to have an op amp with a low voltage offset ($V_{os}$) and low input bias current ($I_b$). Op amps with bipolar input devices, especially laser trimmed, have a low $V_{os}$ but high $I_b$. Op amps having JFET (junction field-effect transistor) input devices, even if laser trimmed, have a low $I_b$ but high $V_{os}$, while op amps using CMOS input devices, as noted above, have lower $I_b$ but higher and less stable $V_{os}$ than JFET or bipolar op amps. Bipolar and JFET technologies, especially when laser trimmed, are expensive and incompatible with low cost digital circuitry.

It is known in the art that these shortcomings may be reduced by chopping the $g_m$ stage. This is conventionally done at a low frequency, for example 10 kHz, and such amplifiers are generally used only with low bandwidth signals. Chopping may be viewed as modulating the input signal up to an amplitude modulation of a carrier frequency, amplifying the AC (alternating current) signal at the carrier frequency, and demodulating it back to a DC (direct current) signal. The demodulated signal then contains the DC offset of the amplifier modulated up to an amplitude modulation of the carrier frequency, which must subsequently be removed by filtering. At a low carrier frequency, this filtering requires large components that are difficult to integrate and that limit the signal bandwidth.

An improved chopping technique provides for greater signal bandwidth by having two amplifiers. The low frequency and high frequency components of the signal are separated; the LF (low frequency) component may be amplified by a LF chopped CMOS op amp with low $V_{os}$ and low $I_b$, while the HF (high frequency) component may be amplified by a parallel wide-band amplifier. The two components are then recombined. However, this approach requires two amplifiers and still requires large low-frequency filtering components.

An alternative approach is to use a single chopped CMOS op amp with an increased modulation frequency on the order of many megahertz. A disadvantage of this approach is that the modulating switches must be made relatively large, and, due to inevitable manufacturing tolerances and resultant dimensional mismatches, these switches induce a large offset voltage and input bias current, partly nullifying the original purpose of the design.

Consequently, a need arises for an op amp with a low $V_{os}$ and low $I_b$ that may be manufactured using low-cost digital-compatible CMOS technology.

SUMMARY OF THE INVENTION

These needs and others are addressed by the improved CMOS op amp of the present invention, which, in one embodiment, provides a chopped CMOS op amp implemented in a deep sub-micron process. The input signal is modulated to an amplitude modulation on a high frequency carrier, where the carrier frequency may, for example, be 100 MHz. The modulator preferably comprises CMOS switches, which function as intended even when the signal swing is rail-to-rail. After modulation, the signal is AC, and may thus be capacitively coupled (with small integrated capacitors due to the high modulation frequency) and level shifted to any convenient DC level.

The differential input stage ($g_m$ stage) may be implemented with simple inverters with any supply voltage exceeding just two saturation voltages plus only a small allowance for the small AC voltage excursion. This $g_m$ stage may be implemented with a single inverter, although a higher $g_m$ (and thus enhanced slew rate and reduced distortion) may be obtained by having two inverters: the first functions as a voltage gain stage, whose gain multiplies up the $g_m$ of the second stage. To maintain overall loop stability, the propagation delay through this voltage gain stage must be very low; however, this stage must be operated at high current levels to achieve low input thermal noise, and it will thus naturally have low delay.

Amplifying the signal as an AC modulation has the further advantage that DC offsets and low frequency noise in the amplifying devices, characteristic of DSM CMOS, are removed at the demodulator. The primary source of offsets and associated low frequency noise are then the modulating switches. These offsets are, in a practical implementation, already lower than would be obtained by DC amplification in DSM CMOS.

Advantages of using a modulation frequency that is as high as the technology permits (e.g., 100 MHz in 0.35 μm 3.3 v technology) are that AC coupling and filtering of the AC signal may be performed by small on-chip components, and the input signal frequency may be as high as 1 MHz, for example.

To accomplish this, the integrator is implemented with inverters which are not cascoded, and the required gain, matching or indeed exceeding that which may be achieved with one cascoded inverter (as would be conventional), is achieved by using three inverters. Such an integrator is inherently unstable: it forms a ring oscillator. It is therefore stabilized by nesting a second compensation capacitor within the outer ring of the integrator, with a Miller capacitor around the second inverter. This configuration is stable.

This architecture is suited for integrated implementation in DSM CMOS while retaining a combination of useful signal amplitude, high overall DC gain, and low input offsets, along with low noise and useful signal bandwidth.

As noted, however, improving amplifier performance by chopping can result in undesired effects. The principal undesired effects are the appearance of a low-frequency square wave at the amplifier output, and charge feedback from the switches into the signal source, particularly due to charge flow imbalance. In accordance with another embodiment of the present invention, an op amp is implemented using a deep-sub-micron low-voltage CMOS technology, where traditional offset reduction techniques (bipolar input devices, laser trimming, etc.) are not available. As noted above, it is known that the input offset voltage of an op amp with a differential mode input stage can be reduced by chopping; that is, periodically reversing the complementary input and output connections of the differential stage.

As explained previously, this chopping process may be viewed as modulating the DC input signal to an AC signal at the switching frequency, amplifying it as an AC signal, and then demodulating it back to a DC signal. Offsets later in the signal path may cause DC offsets, but these are attenuated in closed-loop by the gain of the preceding stages. Ideally, this results in near-zero input DC offset, provided that the modulating switches are perfectly symmetric, particularly in their charge injection due to feedthrough of the switching clocks. Of course, perfect symmetry is not achievable in practice.

The present invention substantially compensates for the high $V_{os}$ and $I_b$ induced by large, mismatched modulating switches, working at a high modulation frequency on the order of 100 MHz, to result in an op amp with relatively low $V_{os}$ and $I_b$ that is fully integratable in a low-cost manufacturing technology compatible with digital circuitry, and further provides a relatively broad signal bandwidth.

For example, in a 0.35 μm 3.3 volt CMOS technology, it is possible to make an op amp with a $V_{os}$ of less than 100 μV (microvolts), $I_b$ less than 5 nA (nanoamperes) and THD (total harmonic distortion) of less than −72 dB (decibels) when used as an amplifying buffer with a useful signal bandwidth of 500 kHz. This combination of specifications is difficult to achieve with other known techniques. The high DC precision CMOS op amp of the present invention exhibits values of $V_{os}$ and $I_b$ that are improved by an order of magnitude over an equivalent high frequency chopped CMOS op amp of the prior art.

In accordance with one aspect of the invention, an improved chopped CMOS operational amplifier is provided that includes a modulator having differential input and output connections, an AC amplifier coupled to the modulator output, a demodulator coupled to the AC amplifier output, and an integrator coupled to the demodulator output. The improvement is realized in that the operational amplifier has a gain path comprising at least four inverting amplifiers, wherein three or a greater odd number of the inverting amplifiers comprise an integrator that is rendered stable by incorporating a nested integrating capacitor within the integrator, and at least one of the inverting amplifiers is coupled to the modulator output and configured as the AC amplifier. Preferably, the modulator and demodulator operate at a clock frequency of at least 50 MHz.

In accordance with one aspect of the invention, first clock signals are coupled to the modulator and demodulator, wherein the demodulator comprises a first demodulator, and a second demodulator is coupled to the AC amplifier output, wherein the second demodulator is operated by second clock signals. A compensating signal is derived from the second demodulator, the compensating signal attenuating input offset voltage components attributable to modulator switch mismatch. The compensating signal derived from the second demodulator acts to adjust at least one characteristic of the first clock signals, which may be an amplitude characteristic. In a preferred form of the invention, the compensating signal derived from the second demodulator is inserted into the primary signal path. The compensating signal comprises first clock signals, and the compensating signal is inserted into the primary signal path by operating the modulator and first demodulator with first clock signals.

In accordance with one aspect of the invention, the first clock signals comprise an ensemble of four amplitude-adjusted clock signals, wherein two of the amplitude-adjusted clock signals are derived from a first system clock phase, and two of the amplitude-adjusted clock signals are derived from a second system clock phase. The first system clock phase is in antiphase with respect to the second system clock phase.

In another form of the invention, the second clock signals are orthogonal with respect to the first clock signals. Both the first clock signals and the second clock signals may comprise a pair of antiphase clock signals, where each one of the second clock signals is orthogonal with respect to each one of the first clock signals.

In still another form of the invention, the compensating signal is derived from the second demodulator by operating the second demodulator with second clock signals that are orthogonal with respect to the first clock signals. Preferably, the compensating signal is derived by remodulating output signals from the second demodulator and reinserting the remodulated signals into the main signal path. The remodulated signals are reinserted into the main signal path by capacitive coupling.

In accordance with still another aspect of the improved chopped CMOS operational amplifier of the present invention, the modulator and demodulator are operated by first clock signals, and an interface network is coupled between the modulator and the AC amplifier, wherein the interface network interrupts the gain path during transitions of the first clock signals. Preferably, the interface network comprises a pair of transistor switches operated by clock signals comprising sequences of relatively narrow pulses substantially centered around the state transitions of the first clock signals, such that each transistor of the pair of transistors is ON when first clock signals are in a steady state, and OFF when first clock signals are changing state.

In a preferred form of the invention, the modulator comprises an arrangement of transistor switches that reconfigures input-to-output connections at the clock rate. This arrangement of transistor switches couples a first input of the modulator to a first output, and a second input of the modulator to a second output, during a first clock phase, then couples the first input to the second output and the second input to the first output during a second clock phase. The first demodulator, on the other hand, reverses the input-to-output reconfiguration introduced by the first modulator.

In accordance with still another aspect of the invention, the first demodulator includes first and second outputs, with a current inverter coupled to one of the outputs to perform differential to single-ended conversion. In an alternative form, the first demodulator may comprise two capacitors per channel, with an associated network of clock-driven MOS transistor switches that enable each of the capacitors to transmit channel current in a first configuration, store channel current in a second configuration, and discharge stored channel current in a third configuration, to accomplish demodulation and differential to single-ended conversion.

In accordance with yet another embodiment of the present invention, a chopped CMOS operational amplifier comprises a primary signal path including an AC amplifier preceded by a first modulator and followed by a first demodulator, wherein the modulator and demodulator are operated by first clock signals, and a second demodulator coupled to the AC amplifier output, the second demodulator operated by second clock signals, wherein a compensating signal is derived from the second demodulator, the compensating signal attenuating input offset voltage components attributable to modulator switch mismatch. Preferably, the compensating signal derived from the second demodulator acts to adjust at least one characteristic of the first clock signals. This characteristic may be an amplitude characteristic of at least one of the first clock signals. The compensating signal derived from the second demodulator is inserted into the primary signal path.

In one form of the invention, the compensating signal is inserted into the primary signal path by operating the modulator and first demodulator with first clock signals. Preferably, the first clock signals comprise an ensemble of four amplitude-adjusted clock signals, wherein two of the amplitude-adjusted clock signals are derived from a first system clock phase, and two of the amplitude-adjusted clock signals are derived from a second system clock phase. The first system clock phase is in antiphase with respect to the second system clock phase.

In accordance with still another form of the invention, the second clock signals are orthogonal with respect to the first clock signals. Both the first clock signals and the second clock signals comprise a pair of antiphase clock signals, wherein each one of the second clock signals is orthogonal with respect to each one of the first clock signals.

The compensating signal may be derived from the second demodulator by operating the second demodulator with second clock signals that are orthogonal with respect to the first clock signals. In one form of the invention, the compensating signal is derived by remodulating output signals from the second demodulator and reinserting the remodulated signals into the main signal path. In a preferred form, the remodulated signals are reinserted into the main signal path by capacitive coupling.

In accordance with still a further form of the invention, the modulator and demodulator are operated by first clock signals, and an interface network is coupled between the modulator and the AC amplifier, wherein the interface network interrupts the gain path during transitions of the first clock signals. The interface network may comprise a pair of transistor switches operated by clock signals comprising sequences of relatively narrow pulses substantially centered around the state transitions of the first clock signals, such that each transistor of the pair of transistors is ON when first clock signals are in a steady state, and OFF when first clock signals are changing state.

In yet another form of the chopped CMOS operational amplifier of the present invention, the modulator comprises an arrangement of transistor switches that reconfigures input-to-output connections at the clock rate. Preferably, the arrangement of transistor switches couples a first input of the modulator to a first output, and a second input of the modulator to a second output, during a first clock phase, then couples the first input to the second output and the second input to the first output during a second clock phase. The first demodulator reverses the input-to-output reconfiguration introduced by the first modulator. In one form, the first demodulator includes first and second outputs, with a current inverter coupled to one of the outputs to perform differential to single-ended conversion. The first demodulator may also comprise two capacitors per channel, with an associated network of clock-driven MOS transistor switches that enable each of the capacitors to transmit channel current in a first configuration, store channel current in a second configuration, and discharge stored channel current in a third configuration, to accomplish demodulation and differential to single-ended conversion.

In accordance with a further embodiment of the present invention, a chopped CMOS operational amplifier comprises a primary signal path including an AC amplifier preceded by a modulator and followed by a demodulator, wherein the modulator and demodulator are operated by first clock signals, and an interface network coupled between the modulator and the AC amplifier, wherein the interface network acts to open the main signal path during transitions of the first clock signals. In a preferred form, the interface network comprises a pair of transistor switches operated by clock signals comprising sequences of relatively narrow pulses substantially centered around the state transitions of the first clock signals, such that each transistor of the pair of transistors is ON when first clock signals are in a steady state, and OFF when first clock signals are changing state.

Further objects, features, and advantages of the present invention will become apparent from the following description and drawings.

DETAILED DESCRIPTION OF THE INVENTION

Figure 3:
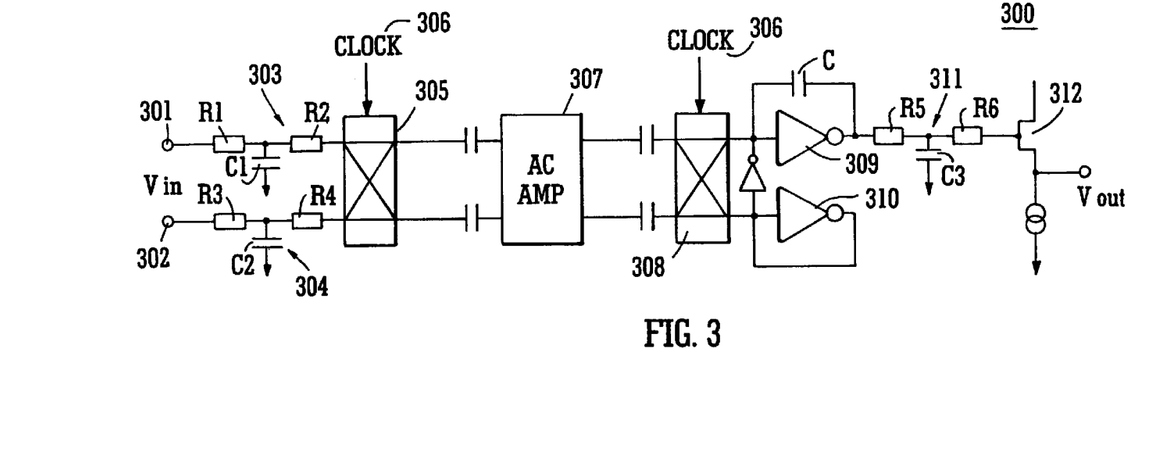
FIG. 3 is a block diagram of a differential input CMOS op amp suitable for operation at a high modulating frequency.

In accordance with the present invention, an improved CMOS op amp is described that offers distinct advantages when compared with op amps of the prior art. FIG. 3 is a block diagram of a differential input CMOS op amp, generally depicted by the numeral 300, that is suitable for operation at a high modulating frequency. In the op amp 300, the input voltage $V_{in}$ is applied between differential inputs 301, 302. Each input includes low-pass filters 303, 304 designed to prevent charge feedback into the signal source at the switching frequency, as will be explained subsequently. Each of the filters 303, 304 is a T-section RC lowpass filter having series resistive elements $R_1$, $R_2$, and $R_3$, $R_4$, respectively, and shunt capacitors $C_1$ and $C_2$, respectively. The filter cutoff frequency is selected so as not to impede designed signal bandwidth.

An input modulator 305 operated by a high frequency clock signal 306 chops the input voltage to an AC signal, in a fashion to be described in greater detail subsequently. The AC signal is amplified by AC amplifier 307. A demodulator 308, operated by the same high frequency clock 306, restores the DC signal at the input to integrator 309, and the integrator output is filtered by RC filter section 311, comprising series resistive elements $R_5$ and $R_6$, and shunt capacitor $C_3$. The filter 311 acts to prevent clock signal components from appearing at the amplifier output. The output of the filter stage 311 is passed to a buffer amplifier 312.

Figure 4:
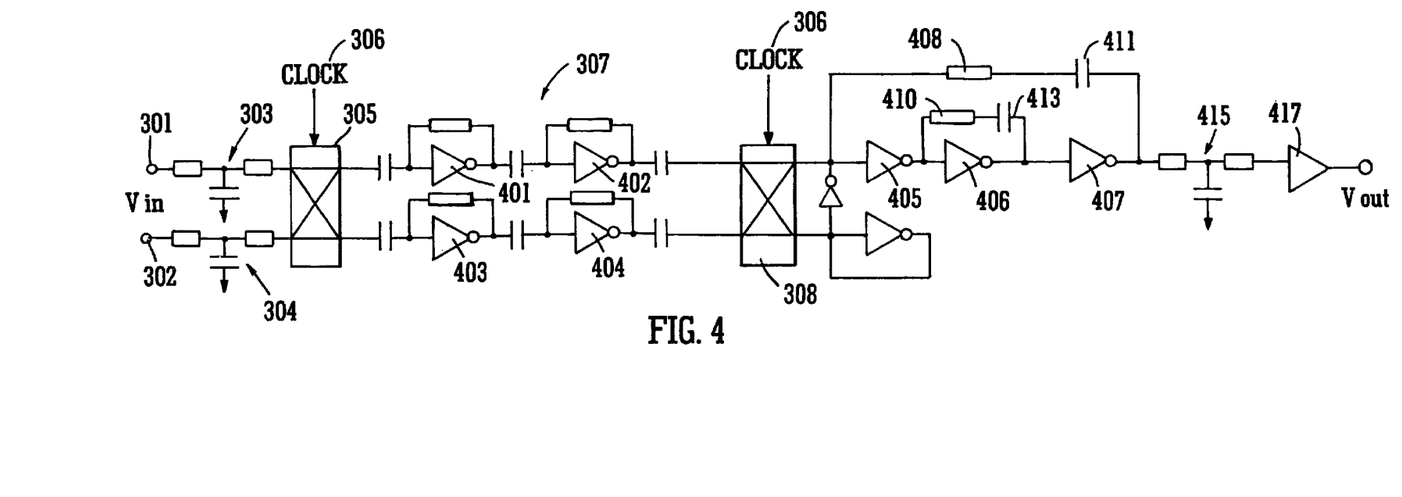
FIG. 4 illustrates, in greater detail, the op amp depicted in FIG. 3.

FIG. 4 illustrates in greater detail the nature and interconnection of the gain stages provided in accordance with one embodiment of the invention. Although the differential input stage ($g_m$ stage) 307 may be implemented with a single inverter, a higher $g_m$ is obtained by using two inverters. The first inverter 401 is a voltage gain stage whose gain multiplies up the $g_m$ of the second stage 402. The same arrangement is used along the path through the inverting input, comprising inverters 403 and 404.

The integrator section that follows the demodulator 306 is implemented with inverters which are not cascoded, and the required gain, matching (or indeed exceeding) that which may be achieved with one cascoded inverter (as would be conventional), is achieved by using three inverters 405, 406, and 407. Of course, an integrator formed from three cascaded inverters would ordinarily demonstrate instability. In order to realize a stable configuration, a second compensating capacitor 411 is nested within the outer ring of the integrator. The Miller capacitor 413 is provided around the second inverter 406. Resistor 408 provided in series with capacitor 411 and resistor 410 in series with capacitor 413 act to prevent high frequency feed-forward, as will be appreciated by one skilled in the art.

The residual offset in such an op amp will come from the inevitable switch mismatches, due to manufacturing tolerances. In this sample design, if the input switches have ±1% width and length tolerance with worst case corner distribution, an input offset of 1 mV results. In accordance with the present invention, the capability is provided to detect the voltage offset due to mismatched charge injection, discriminate between this and the (desired) signal voltage, and compensate out the unwanted offset.

In the example introduced herein, this results in a reduction of the input offset from 1 mV to 100 μV. The dominant remaining source of input offset is then DC asymmetry in the differential-to-single-ended converter, at the interface between the AC amplifier and the DC integrator. This is attenuated by the gain of the preceding AC amplifier, and thus may be expected to be less than 100 μV effective in a realistic implementation.

There are, in addition, synergistic aspects of the implementation details described herein that have the effect of making the internal switching associated with the chopping technique only minimally apparent to the user at the inputs and outputs. This is achieved by exploiting the speed of DSM CMOS and using an unusually high modulating frequency of 100 MHz. At this frequency, a simple internal RC filter at the input reduces the backwards propagation of the charge injection from the modulator switches into the signal source, making the op amp benign to drive, and a similar filter in the output path reduces the AC component in the output.

When net charge is injected into the signal path at the input by switch capacitance mismatch, it will cause an instantaneous rise (or fall) in voltage, which will decay due to backwards charge redistribution into the RC input filter referenced above, and the unwanted voltage disturbance will be greater at the beginning of the clock phase than later. However, the desired signal will be present uniformly throughout the clock phase. This signal distribution is used to discriminate between the unwanted voltage disturbance and the desired signal, as explained below.

Figure 5:
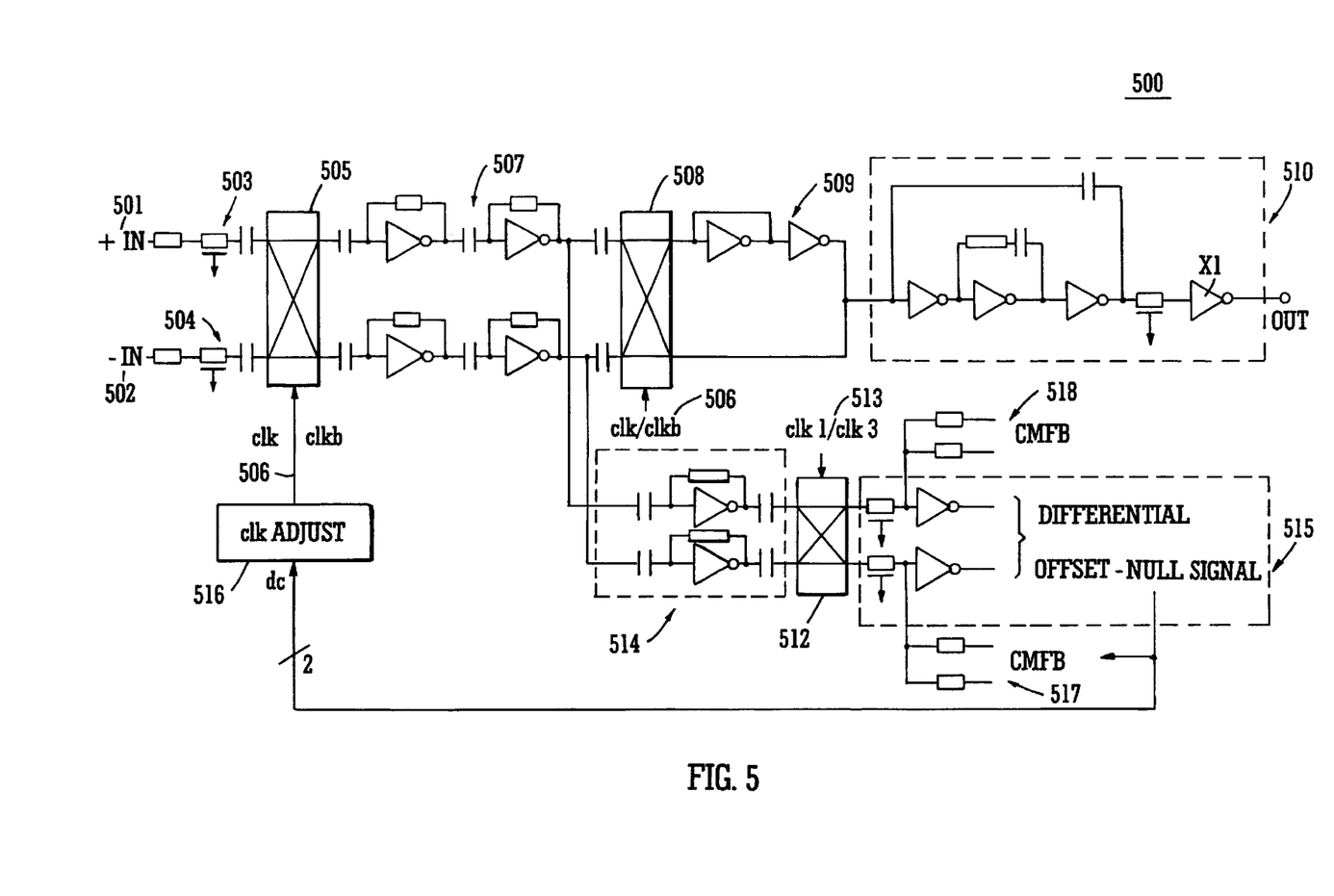
FIG. 5 is a block diagram of an op amp incorporating an offset compensation technique in accordance with the present invention.

The amplifier 500 illustrated in FIG. 5 has a familiar basic architecture, although the detail implementation is unfamiliar due to the characteristics of DSM CMOS, which are very different from the bipolar processes usually used for a high precision op amp. As discussed previously with reference to FIG. 4, the amplifier 500 has 5 gain stages to achieve an open loop DC gain of 1000 V/mV, with each gain stage implemented as a simple CMOS inverter. The low delay of a DSM inverter is exploited to achieve a stable gain-bandwidth of tens of MHz, higher than would be usual for a precision op amp. Of course, the improvement in offset performance described below can be achieved even in the absence of the multiple gain stage implementation, and it is not intended that the dual demodulator approach (described in detail below) be limited to a multiple gain stage, DSM CMOS implementation. Improvements in chopped amplifier performance will be noted even where the technique is used with a conventional amplifier architecture.

The amplifier 500 includes differential mode inputs 501, 502 and lowpass filter sections 503, 504 similar to the input arrangement described in conjunction with FIG. 4. The input signal is chopped by modulator 505, driven by clock signal clk/clkb 506 (that will be discussed in more detail subsequently). The output of the modulator is applied to an AC amplifier 507.

The chopped signal is demodulated by a demodulator 508 and coupled to the output stages of the amplifier 500. For the sake of simplicity in FIG. 5, the output stage is shown as a single-ended output, and for that purpose a current inverter 509 provides differential-to-single-ended conversion at the output of the demodulator 508. The output stage 510 is similar to the arrangement discussed in conjunction with FIG. 4.

An alternative signal path is illustrated in FIG. 5 through an amplifier section 514 to a second demodulator 512 that is driven by clock signal clk1/clk3 513. The second demodulator 512 demodulates the AC waveform from the AC amplifier section 507 with clock pulses which sample the waveform symmetrically around the beginning of each clock phase. This may alternatively be described as demodulating the waveform with a phase shift of 90 degrees or orthogonally to the modulation.

Figure 7:
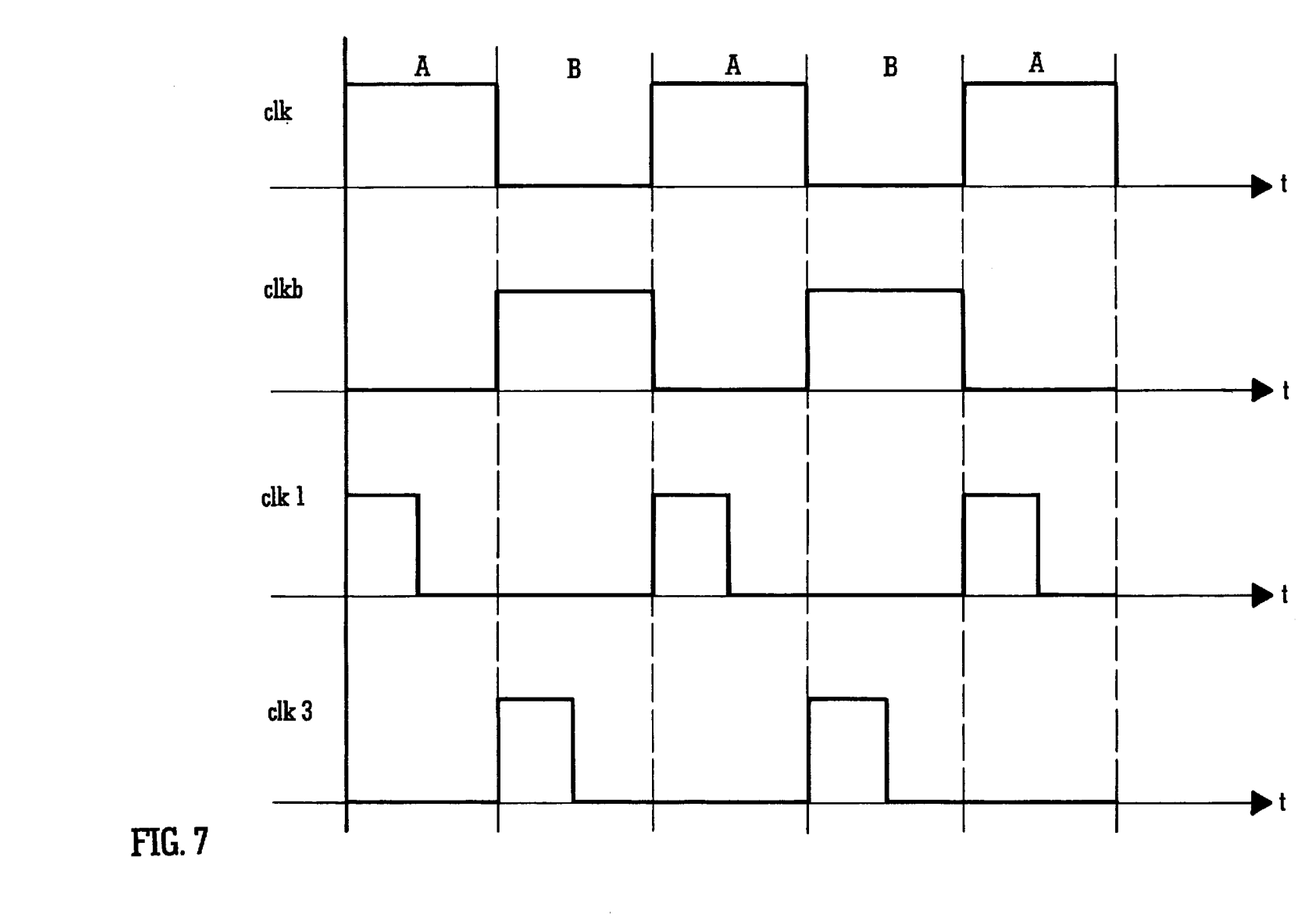
FIG. 7 is a timing diagram showing the relationship among the clock signals utilized in the op amp of FIG. 5.

A timing diagram is presented in FIG. 7 that illustrates the relationships among these clock signals. Clock signal clkb is 180° out of phase with system clock signal clk. Clock signal clk1, as shown in FIG. 7, occurs near the beginning of phase A of the system clock clk, while clock signal clk3 occurs near the beginning of system clock phase B.

Ideally, this results in zero response to the signal amplitude. However, because of the charge redistribution effect introduced by the RC elements 503, 504 (FIG. 5) preceding the modulator 505, the charge injection due to switch mismatch appears as a voltage spike centered within the demodulation window of the second demodulator 512, and is thus demodulated with full amplitude. The DC voltage output from this second demodulator 512 thus preferentially represents the switch mismatch, and ideally contains no response to the input signal. If this DC voltage output is used to null out the effect of the switch mismatch, this relative sensitivity results in the desired signal still being recoverable from the main signal path demodulator 508.

Once a voltage has been recovered from the second demodulator 512, which represents the error created by the switch mismatch, it may be used to null out the switch mismatch in various ways, broadly classifiable as feedforward into the signal path or feed-back. The technique illustrated in FIG. 5 works by feed-back. The charge injection by the modulator switches is a product of each switch capacitance and the clock voltage amplitude to that switch. If the switch capacitance is mismatched to another (supposedly matched) switch, this may be compensated to achieve matching charge injection by creating a compensating mismatch in the clock amplitudes.

In the case where the switch capacitance is high, the clock amplitude is made correspondingly low. This is done in closed loop so that little precision is needed in the loop. All that is needed is to know correctly the sign of the mismatched charge injection. This makes feed-back easier to implement than feed-forward.

The modulator switches can be grouped into two groups: those that introduce a positive offset if too large, and those that introduce a negative offset if too small. These are driven by different clock waveforms, which are fine-tuned in relative amplitude in response to the DC voltage output from the second demodulator 512. This closes the loop and results in the op amp 500 nulling out the residual offset due to modulator asymmetry.

Figure 6:
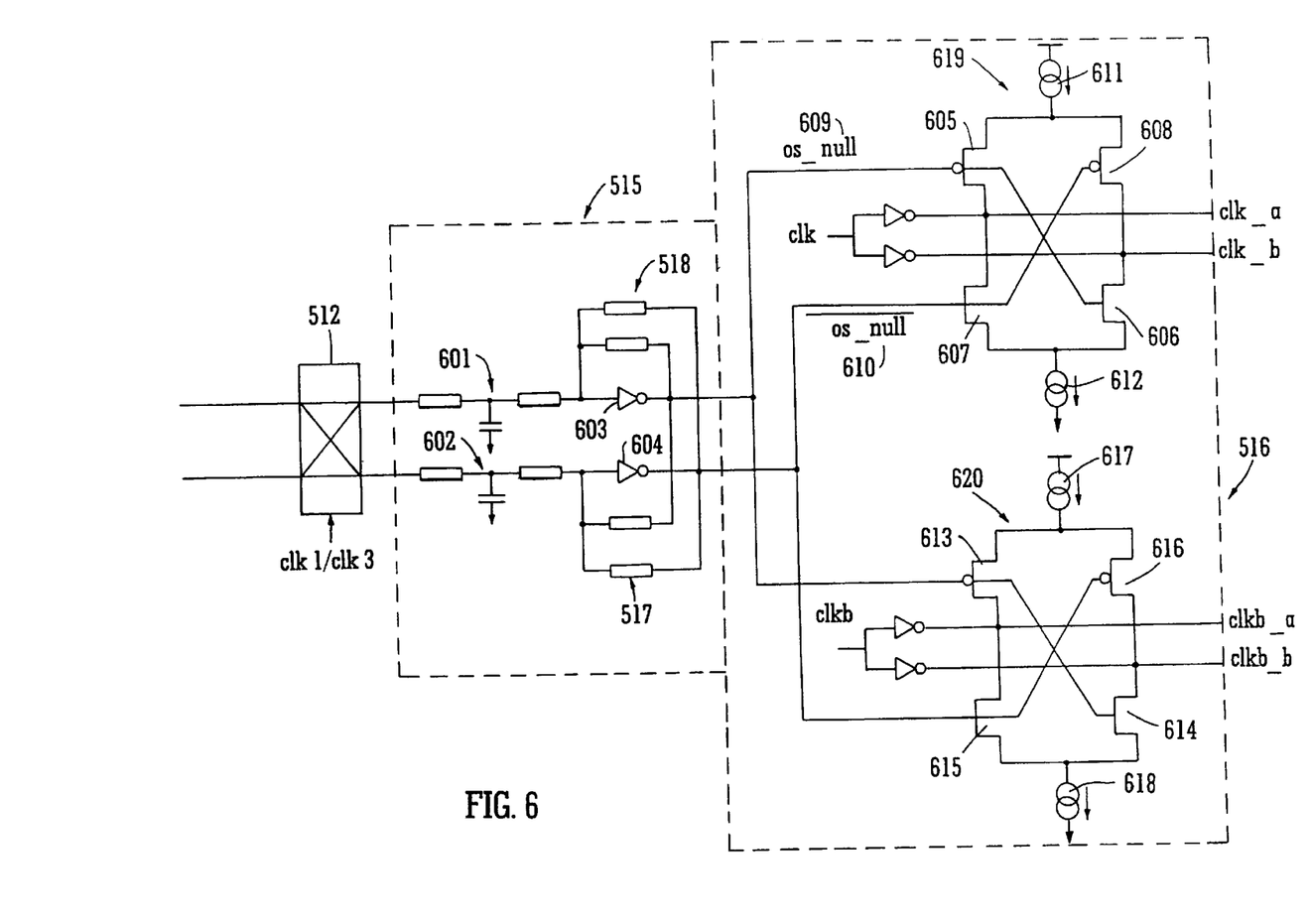
FIG. 6 illustrates development of signals in the path of the second demodulator depicted in FIG. 5.

FIG. 6 illustrates signal development in the second demodulator 512 path. Network 515 provides low pass filtering by virtue of T-section RC lowpass filters 601, 602, and buffering through buffer stages 603, 604 prior to application to the clock adjust network 516.

The DC output of network 515, characterized as the differential offset null signal in FIG. 5, is applied to the clock adjust network 516 along with antiphase system clock signals clk and clkb. As mentioned previously, due to the high-speed capability of DSM CMOS circuitry, the system clock signal frequency may be as high as 100 MHz.

Clock adjust sub-networks 619, 620 derive clock output signals clk_a, clk_b, clkb_a, and clkb_b that are amplitude adjusted in response to the offset null signals derived from the second demodulator 512. One of the differential offset null outputs 609 is applied to the gates of p-channel input transistors 605, 613, which are cross-coupled to the gates of n-channel output transistors 606, 614, respectively. The other differential offset null signal 610 is coupled to the gates of n-channel input transistors 607, 615 and to the gates of p-channel output transistors 608, 616. Output signals clk_a and clkb_a increase in amplitude when offset null signal 609 increases, while clk_b and clkb_b increase in amplitude as the offset null signal 609 decreases, due to the DC tail currents 611 and 612 being preferentially steered into clk_a or clk_b respectively, and tail currents 617, 618 being preferentially steered into clkb_a or clkb_b, respectively, which dilutes the switched components.

The differential signal path illustrated in FIG. 5 requires that the common-mode voltage of 609 and 610 (FIG. 6) be defined by feedback networks 517, 518 (resistors in the preferred embodiment), which, to a first approximation, have zero summed feedback of differential voltages on signals 609 and 610, but unity gain feedback of common mode voltages. Consequently, the amplifiers 603 and 604 have (to a first approximation) infinite DC differential gain to the output of the second demodulator 512, but low DC common mode gain. Possible applications include analog signal processing in a high speed signal acquisition and processing IC, where this op amp matches the state-of-the-art of A/D converters in sample rate and accuracy, and where it is desired to integrate full functionality in an economical DSM process.

Figure 18:
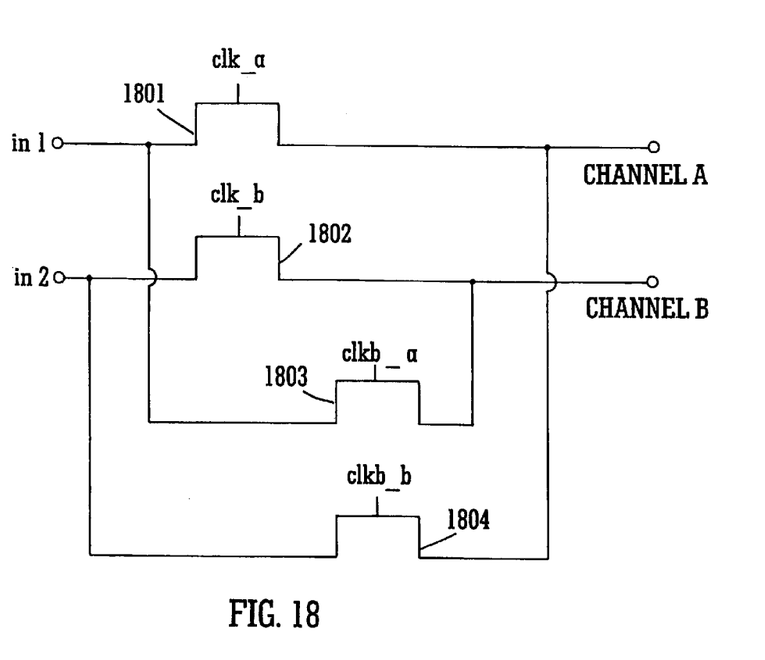
FIG. 18 is a schematic diagram of a modulator suitable for use with the amplifier of FIG. 5.

In order to implement the technique described above with reference to FIG. 5, the modulator 505 must be designed to operate with four clock inputs, instead of the customary two. FIG. 18 is a schematic representation of a modulator suitable for use with the amplifier of FIG. 5.

In the modulator of FIG. 18, a first set of NMOS switching transistors 1801, 1802 is designed to be driven by clk_a and clk_b, which, as described above, are amplitude-adjusted versions of the first phase master clock signal clk. A second pair of NMOS switches 1803, 1804 is driven by clock signals clkb_a and clkb_b, which are amplitude-adjusted versions of orthogonal master clock signal clkb. The offset null signals 609, 610 that ultimately control the amplitudes of the individual clock signals clk_a, clk_b, clkb_a, and clkb_b are responsive to the unwanted charge injection caused by switch mismatch. Thus, allowing these signals clk_a, clk_b, clkb_a, and clkb_b to control the amplitude of each input signal in1, in2 that is steered into the modulator outputs (channel a, channel b) directly compensates for the unwanted switch mismatch effect that would otherwise distort modulator output signal amplitude.

Figure 17:
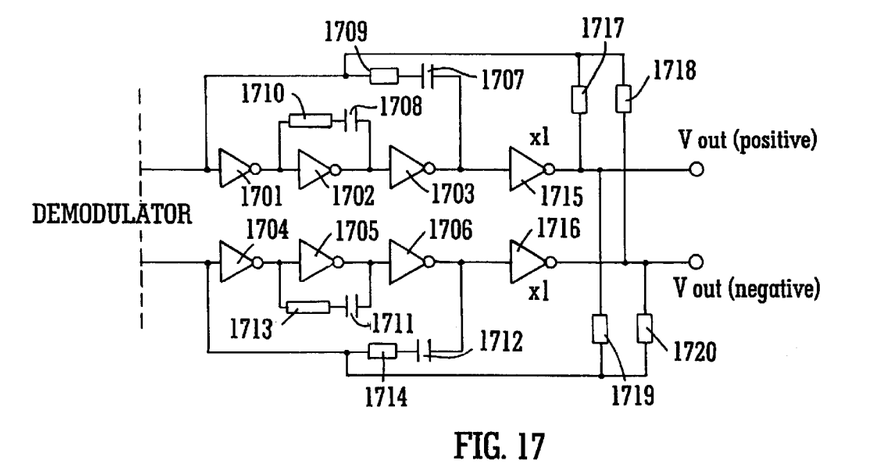
FIG. 17 depicts differential output equivalent structures suitable for use with the amplifiers of FIGS. 3, 4, 5, and 9.

The amplifiers of FIGS. 3, 4, 5, and 9 all have differential inputs and single-ended outputs, as are most commonly required. However, it will be apparent to one skilled in the art that in some applications, differential outputs may be required. All of the amplifier variants described herein may be converted to differential output equivalent structures by eliminating the differential to single-ended converter and modifying the integrator as shown in FIG. 17.

Two integrators are now required, each substantially identical to the single integrators shown previously. The integrator in the non-inverting signal path is formed by inverters 1701–1703, with Miller capacitor 1708 provided around the second inverter 1702. Resistor 1709 provided in series with capacitor 1709 and resistor 1710 in series with capacitor 1708 act to prevent high frequency feed-forward. In the inverting signal path, the integrator is provided by inverters 1704–1706 with Miller capacitor 1711, and resistors 1713 and 1714 provided to prevent high frequency feed-forward. Output buffer stages 1715, 1716 are provided for each output stage.

It will be apparent that the output common mode voltage is now not well defined, so among other techniques familiar to those skilled in the art, common mode feedback may be employed, as illustrated. Four resistive elements 1717–1720 are used, which may each be implemented conventionally as a physical resistor or as a switched capacitor equivalent resistor, as is well-known. These resistors 1717–1720 are connected to provide strong feedback of common mode voltages but weak feedback of differential voltages, according to the manner already described in conjunction with the amplifier of FIG. 5. This provides tight control of the output common mode voltage while attenuating the differential gain very little. In other words, the output stage has very high DC differential gain, but low DC common mode gain.

Figure 8:
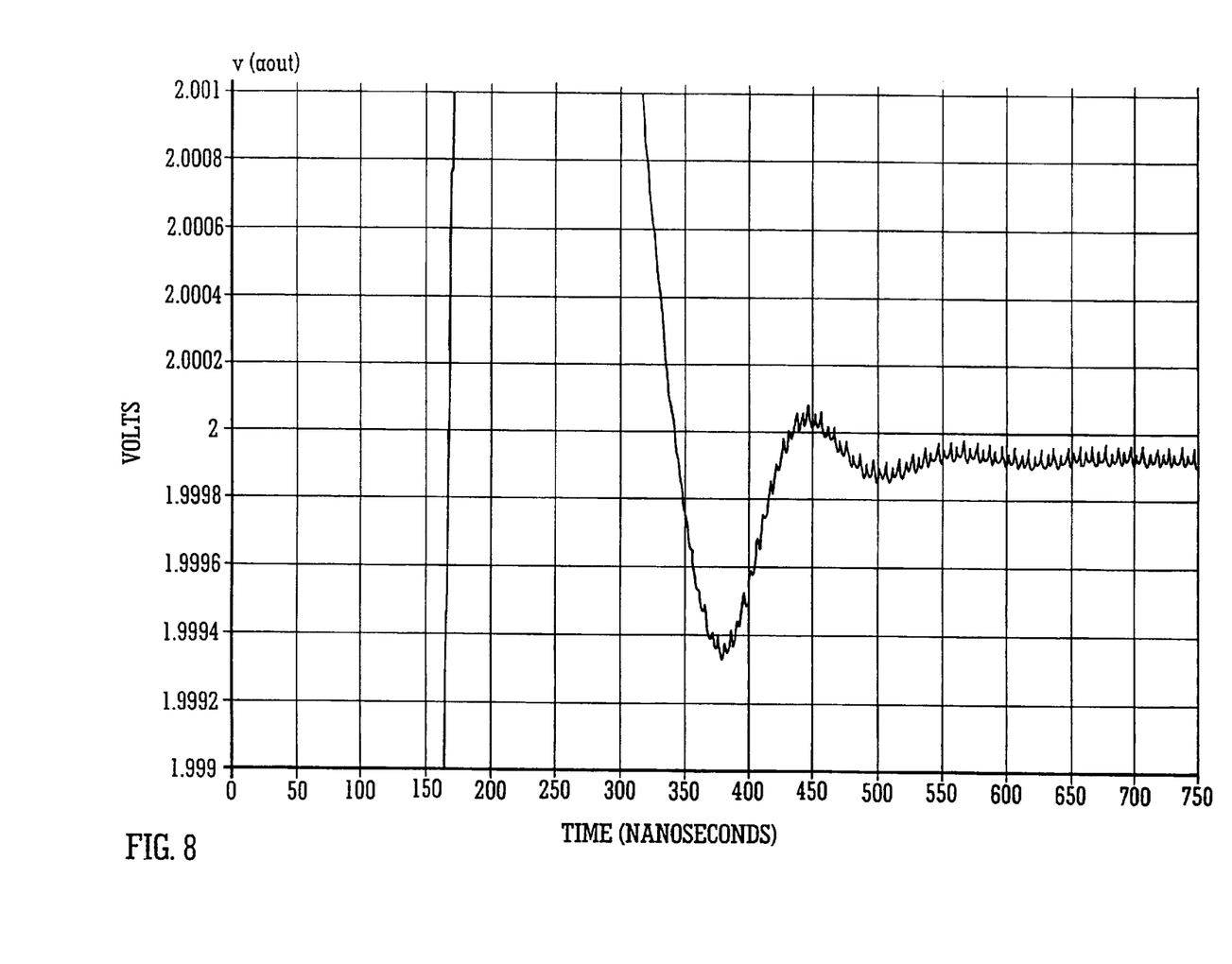
FIG. 8 depicts settling time for the system of FIG. 5.

Because the offset null loop has a high bandwidth, the user application signal loop and the offset null loop slew and settle simultaneously. In this implementation in 3 volt 0.35 $\mu$m CMOS, 100 $\mu$V absolute output accuracy is achieved at unity gain within 600 ns (nanoseconds), with 1.5 v signal swing. System settling time is illustrated in FIG. 8.

Figure 9:
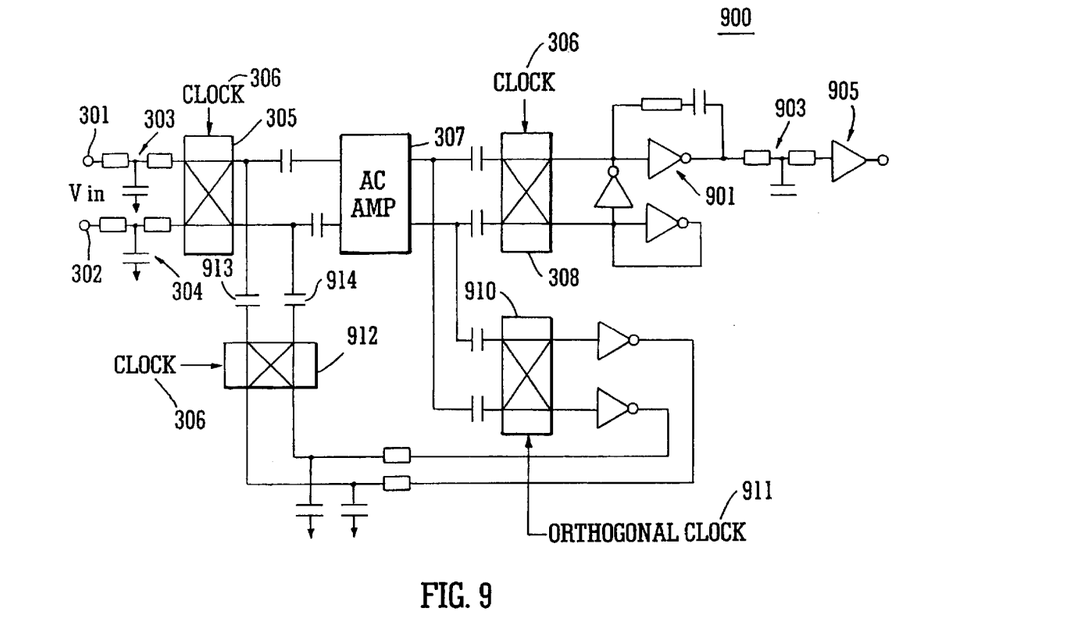
FIG. 9 is a simplified block diagram of an op amp incorporating yet another offset reduction technique in accordance with the present invention.

It is also possible, with only minor degradation in system performance, to compensate for modulator switch mismatch through a somewhat simpler feed-back technique. FIG. 9 is a simplified block diagram of an implementation of this technique, generally depicted by the numeral 900. The input stages of the amplifier 900 are essentially the same as those described with reference to FIG. 3 above. At the output of the demodulator 308, there is an integrator 901, low pass filter 903, and output buffer 905.

The amplifier 900 differs from the amplifier 500 described with reference to FIG. 5 in that there is no provision for clock amplitude adjustment after the second demodulator 910, driven by an orthogonal clock signal 911. Instead, the output signal from this second demodulator 910 is modulated back up to an AC signal by modulator 912, then inserted back into the signal path by small value capacitors 913, 914 in anti-phase to the AC signal created by the signal mismatch of the signal modulator switches. Thus, this embodiment compensates the offset due to switch mismatch by feedforward into the signal path of an inversion of the error, rather than feedback of the error to the clock voltages.

Figure 10:
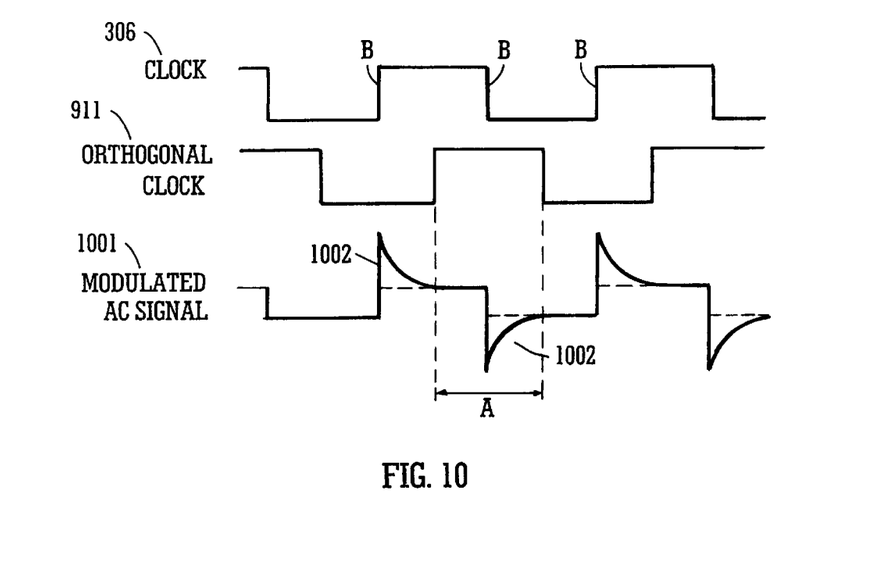
FIG. 10 is a timing diagram illustrating selected signals associated with the op amp of FIG. 9.

The timing diagram of FIG. 10 shows the relationships among the signals of interest. The main signal path modulator 305 and demodulator 308 are driven by the master clock signal 306, which may be on the order of 100 MHz. The modulated AC signal 1001 illustrated in FIG. 10 shows the uncompensated clock feedthrough voltage spikes 1002 that occur due to modulator switch mismatch. It should be noted that these voltage spikes occur immediately after the edges B of the modulator clock signal 306.

Because the clock signal 911 that drives the second demodulator 910 is orthogonal with respect to the modulator clock 306, the undesired clock feedthrough response 1002 appears approximately centered within each half cycle A of the orthogonal clock signal 911. The energy in this window A contains clock feedthrough, but effectively zero signal component.

Figure 11:
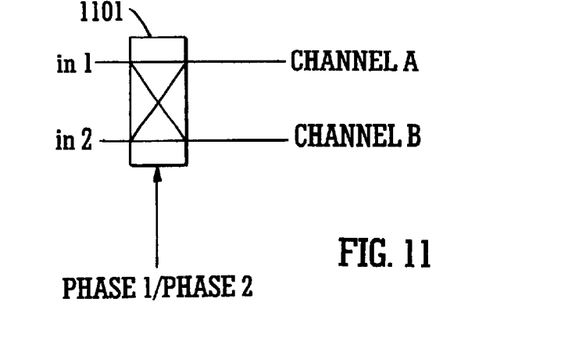
FIG. 11 shows a symbol used to illustrate a modulator in a chopped op amp.

FIG. 11 illustrates a customary symbol for a modulator 1101 of the type used for modulator 305 in FIGS. 4 and 9, for example. Input signals in1 and in2 are applied to the modulator 1101, and the modulator is driven by orthogonal clock signals phase1/phase2 as shown. The signals phase1/phase2 may be identical to signals clk and clkb illustrated in FIG. 7. The notation phase1/phase2 is particularly appropriate for the clock signal applied to a modulator in a chopped amplifier application, where the input-to-output connections are reversed at the clock rate.

Figure 12:
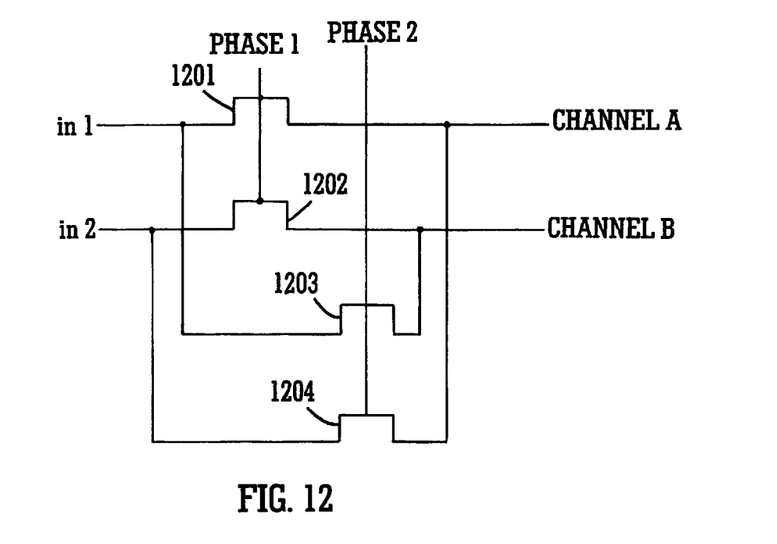
FIG. 12 is a schematic diagram of the modulator depicted in FIG. 11.

FIG. 12 shows the transistor arrangement within the modulator 1101. The modulator comprises four MOS transistor switches 1201–1204, which may be NMOS-only, PMOS-only or complementary-MOS (CMOS), depending upon the signal voltage level relative to the clock voltage level. The implementation illustrated in FIG. 12 shows NMOS-only, suitable where the clock voltage is, for example, 0 to 5 volts, and the input signal range is less than that (0 to 2.5 volts, for example). The clock signal has two phases, phase1 and phase2. On clock phase1, the connection is straight through; input channel in1 is coupled to output connection channel a, and input channel in2 is coupled to output connection channel b. On the phase2 clock, the connections are switched; in1 is coupled to channel b and in2 is coupled to channel a.

Figure 13:
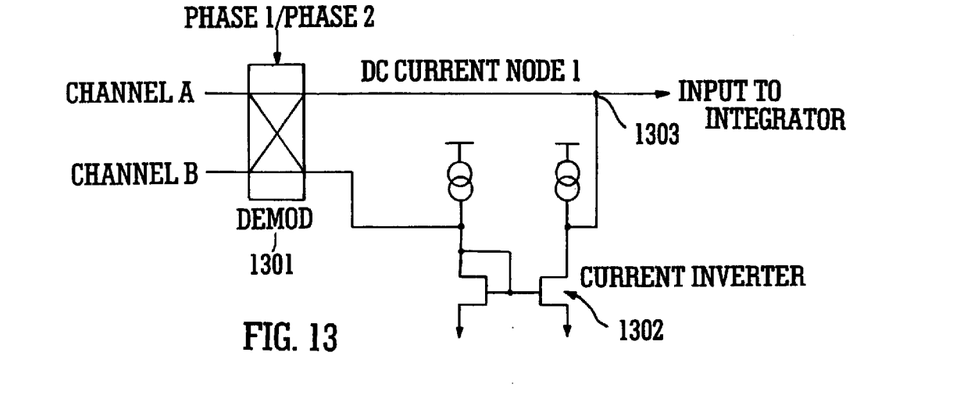
FIG. 13 shows a demodulator and differential to single-ended converter in a chopped CMOS op amp.

A demodulator, such as demodulator 308 in FIGS. 4 and 9, may be implemented in several ways. FIG. 13 illustrates the simplest form, in which the demodulator 1301 is identical to the modulator and simply reverses the periodic exchange of channel a and channel b introduced by the modulator. Strictly speaking, this type of demodulation produces two demodulated, and therefore DC, current versions of the required signal: one inverted relative to the other. Thus, a differential to single-ended conversion is normally carried out.

In the simplest possible single-ended conversion, the inverted DC current is simply discarded. This has the disadvantage that the amplifier input is then truly sensitive to the input voltage for only one-half of each clock cycle, resulting in loss of gain and aliasing of signal frequencies close to the modulator clock frequency. Consequently, FIG. 13 also depicts the inverted DC current being passed through a DC current inverter 1302, and the two DC currents being summed at DC current node 1 1303 before being passed along to the integrator. These inversion and summation operations accomplish the desired differential to single-ended conversion.

The disadvantage of this approach is that noise in the DC current inverter is added into the signal path. Its amplitude (referenced back to the input) appears divided by the ratio of the transconductance of the AC amplifier to the transconductance of the DC current inverter. Thus, it is desirable that the DC current inverter have a very low transconductance, to minimize its input-referenced noise contribution. It then becomes slow and causes various difficulties, such as degrading the amplifier's overall transient response.

Figure 14:
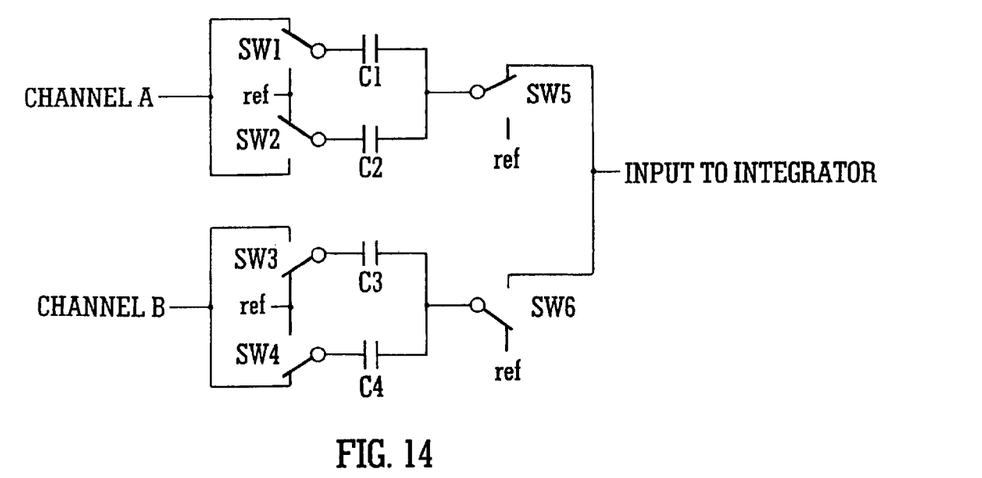
FIG. 14 illustrates an alternative arrangement for demodulation and differential to single-ended conversion.

The implementation illustrated in FIG. 13 represents one way in which demodulation and differential to single-ended conversion may be accomplished. FIG. 14 illustrates an alternative implementation in which demodulation and differential to single-ended conversion are performed through the combination of capacitors $C_1$–$C_4$ and two-phase change-over switches SW1–SW6. The switches SW1–SW6 actually comprise two MOS switches per two-phase change-over switch shown. As discussed previously with reference to the modulator switches of FIG. 12, the transistor switches SW1–SW6 of FIG. 14 may be NMOS-only, PMOS-only, or CMOS, depending upon the integrator quiescent input voltage level relative to the available clock voltage swing. Typically, the transistor switches SW1–SW6 will be NMOS-only, with an integrator input voltage of 1 volt and a clock voltage swing of 0 to 5 volts.

The switches SW1–SW6 are shown with the connection existing during one of the two clock phases and they are reversed in the other clock phase. The nodes labelled "ref" are connected to a voltage substantially equal to the quiescent input voltage of the integrator.

During the clock phase shown, when the output current from channel a is of the correct sign, capacitor $C_1$ passes the output current from channel a directly into the subsequent integrator stage (not shown). The output current from channel b is of the inverted sign and is passed into capacitor $C_4$ and stored for use on the next clock cycle. During this same clock phase, a charge is available on capacitor $C_2$ that was absorbed from channel a during the previous clock phase when the output current from channel a was of the inverted sign. The capacitor is thus reversed to invert the charge and is shown being discharged into the input to the integrator. Capacitor $C_3$ is shown on this clock phase being discharged ready for use on the next clock phase.

Thus, over the complete two-phase clock cycle, the integrator receives the output currents from both channels of the AC amplifier on both clock phases, correctly demodulated, inverted, and summed into the integrator.

Figure 15:
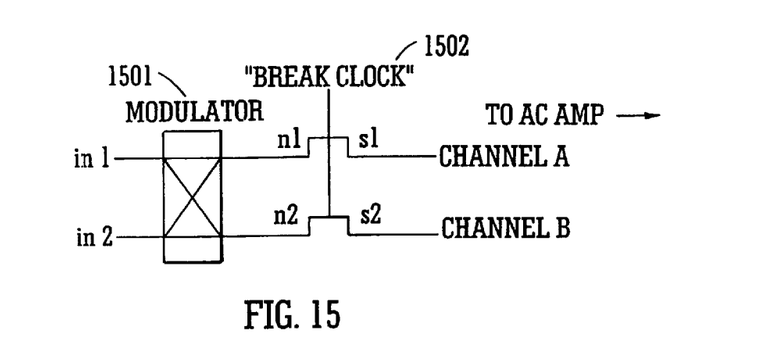
FIG. 15 shows an alternative technique for minimizing the effects of unequal charge injection in a chopped CMOS op amp.

Suppressing offsets in the modulator switches by sensing the charge injection on the clock edges with an orthogonal demodulator and feeding back a compensating signal provides substantial improvements in amplifier performance. FIG. 15 shows an alternative way of suppressing such offsets.

FIG. 15 illustrates the placement of two switches S1 and S2 added in series with the inputs to the AC amplifier (similar to the AC amplifier 505 of FIG. 5), and driven by a "break clock" 1502 which goes low (i.e., OFF) for a short period while the input modulator 1501 is changing state. The effect of unequal charge injection from the modulator switches should be considered: if inputs in1 and in2 are connected to low impedance sources, while the modulator 1501 is in either clock-driven state, nodes n1 and n2 are connected via modulator switches to low impedance sources, and have well-controlled voltages.

Switches S1 and S2 are turned off while n1 and n2 are still well-controlled. During the change-over of the modulator, unequal charges may be injected into n1 and n2, but these charges cannot enter the AC amplifier and are simply stored momentarily on the parasitic capacitances of nodes n1 and n2. When the modulator 1301 has completed its change-over, n1 and n2 are again connected to low impedance voltage sources and are well-behaved, and n1 and n2 are then connected once again to the AC amplifier. Thus, the effect of mismatch in the modulator switches is suppressed.

Figure 16:
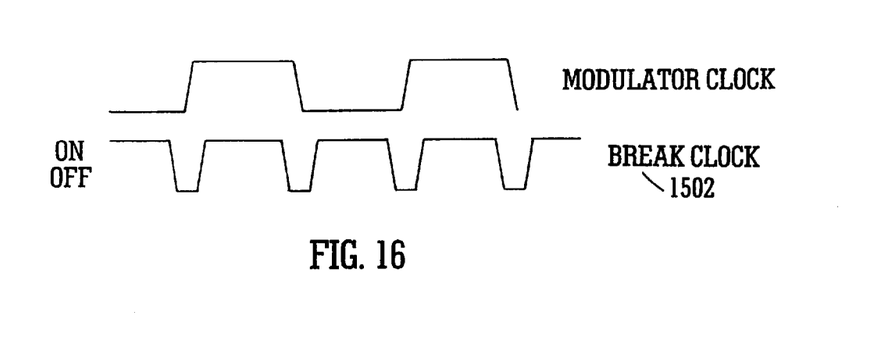
FIG. 16 is a timing diagram illustrating the relationship among selected signals depicted in FIG. 15.

However, employing this technique does not simply move the matching problem to the switches S1 and S2. The timing diagram of FIG. 16 shows the relationship between the break clock signal 1502 and the rising and falling edges of the modulator clock. It should be noted that, as S1 and S2 enter their high impedance state, on the falling edge of the break clock pulse, S1 and S2 insert some charge into the AC amplifier, which may in general be unequal between channel a and channel b. However, these switches S1 and S2 are pulsed twice per clock cycle, and the effect of mismatch between S1 and S2 is to insert unequal "glitches" into channels a and b at twice the clock frequency.

These glitches are demodulated downstream by the demodulator to a null signal. Thus, mismatch in the input switches does not greatly affect the amplifier's input voltage offset.

The advantage of this method over the orthogonal demodulation technique described previously is its simplicity. This simple technique also has two disadvantages, however. First, there are two short periods during each clock cycle where the channel is unresponsive to the amplifier input voltage. This reduces the gain and causes weak aliasing of input signals close to the clock frequency. Second, mismatched modulator switches still cause charge pumping between the inputs and degrade the input offset current, and thus this method does not work ideally if the signal source has a high impedance.

There has been described herein a CMOS operational amplifier that is improved over the prior art. It will be apparent to those skilled in the art that modifications may be made without departing from the spirit and scope of the invention. Accordingly, it is not intended that the invention be limited except as may be necessary in view of the appended claims.

What is claimed is:

1. An improved chopped CMOS operational amplifier including:
    a modulator having differential input and output connections;
    an AC amplifier coupled to the modulator output;
    a demodulator coupled to the AC amplifier output; and
    an integrator coupled to the demodulator output;
    wherein the improvement comprises:
        the operational amplifier has a gain path comprising at least four inverting amplifiers;
        three or a greater odd number of the inverting amplifiers comprise an integrator that is rendered stable by incorporating a nested integrating capacitor within the integrator; and
        at least one of the inverting amplifiers is coupled to the modulator output and configured as the AC amplifier.

2. The improved chopped CMOS operational amplifier of claim 1, wherein the modulator and demodulator operate at a clock frequency of at least 50 MHz.

3. The improved chopped CMOS operational amplifier of claim 1, further comprising:
    first clock signals coupled to the modulator and demodulator, and wherein said demodulator comprises a first demodulator; and
    a second demodulator coupled to the AC amplifier output, the second demodulator operated by second clock signals.

4. The improved chopped CMOS operational amplifier of claim 3, wherein a compensating signal is derived from the second demodulator, the compensating signal attenuating input offset voltage components attributable to modulator switch mismatch.

5. The improved chopped CMOS operational amplifier of claim 4, wherein the compensating signal derived from the second demodulator acts to adjust at least one characteristic of said first clock signals.

6. The improved chopped CMOS operational amplifier of claim 5, wherein said characteristic is an amplitude characteristic of at least one of said first clock signals.

7. The improved chopped CMOS operational amplifier of claim 4, wherein the compensating signal derived from the second demodulator is inserted into the primary signal path.

8. The improved chopped CMOS operational amplifier of claim 4, wherein the compensating signal comprises first clock signals, and the compensating signal is inserted into the primary signal path by operating the modulator and first demodulator with first clock signals.

9. The improved chopped CMOS operational amplifier of claim 8, wherein first clock signals comprise an ensemble of four amplitude-adjusted clock signals, wherein two of the amplitude-adjusted clock signals are derived from a first system clock phase, and two of the amplitude-adjusted clock signals are derived from a second system clock phase.

10. The improved chopped CMOS operational amplifier of claim 9, wherein the first system clock phase is in antiphase with respect to the second system clock phase.

11. The improved chopped CMOS operational amplifier of claim 3, wherein said second clock signals are orthogonal with respect to said first clock signals.

12. The improved chopped CMOS operational amplifier of claim 3, wherein both said first clock signals and said second clock signals comprise a pair of antiphase clock signals, and wherein each one of said second clock signals is orthogonal with respect to each one of said first clock signals.

13. The improved chopped CMOS operational amplifier of claim 4, wherein said compensating signal is derived from said second demodulator by operating said second demodulator with second clock signals that are orthogonal with respect to said first clock signals.

14. The improved chopped CMOS operational amplifier of claim 13, wherein said compensating signal is derived by remodulating output signals from said second demodulator and reinserting said remodulated signals into the main signal path.

15. The improved chopped CMOS operational amplifier of claim 14, wherein said remodulated signals are reinserted into the main signal path by capacitive coupling.

16. The improved chopped CMOS operational amplifier of claim 1, wherein said modulator and demodulator are operated by first clock signals, and an interface network is coupled between the modulator and the AC amplifier, wherein the interface network interrupts the gain path during transitions of said first clock signals.

17. The improved chopped CMOS operational amplifier of claim 16, wherein the interface network comprises a pair of transistor switches operated by clock signals comprising sequences of relatively narrow pulses substantially centered around the state transitions of said first clock signals, such that each transistor of said pair of transistors is ON when first clock signals are in a steady state, and OFF when first clock signals are changing state.

18. The improved chopped CMOS operational amplifier of claim 3, wherein the modulator comprises an arrangement of transistor switches that reconfigures input-to-output connections at the clock rate.

19. The improved chopped CMOS operational amplifier of claim 18, wherein the arrangement of transistor switches couples a first input of the modulator to a first output, and a second input of the modulator to a second output, during a first clock phase, then couples the first input to the second output and the second input to the first output during a second clock phase.

20. The improved chopped CMOS operational amplifier of claim 18, wherein said first demodulator reverses the input-to-output reconfiguration introduced by said first modulator.

21. The improved chopped CMOS operational amplifier of claim 20, wherein the first demodulator includes first and second outputs, with a current inverter coupled to one of said outputs to perform differential to single-ended conversion.

22. The improved chopped CMOS operational amplifier of claim 20, wherein said first demodulator comprises two capacitors per channel, with an associated network of clock-driven MOS transistor switches that enable each of said capacitors to transmit channel current in a first configuration, store channel current in a second configuration, and discharge stored channel current in a third configuration, to accomplish demodulation and differential to single-ended conversion.

\* \* \* \* \*